US012620942B2

(12) United States Patent
    Ishihara et al.

(10) Patent No.: US 12,620,942 B2
(45) Date of Patent: May 5, 2026

(54) BIAS CIRCUIT FOR STACKED POWER AMPLIFIERS WITH A VARIABLE POWER SUPPLY

(71) Applicant: Murata Manufacturing Co., Ltd., Kyoto (JP)

(72) Inventors: Shota Ishihara, San Diego, CA (US); Rui Ma, Carlisle, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 471 days.

(21) Appl. No.: 18/307,494

(22) Filed: Apr. 26, 2023

(65) Prior Publication Data
     US 2024/0364274 A1     Oct. 31, 2024

(51) Int. Cl.
    H03F 1/30      (2006.01)
    H03F 1/56      (2006.01)
    H03F 3/21      (2006.01)

(52) U.S. Cl.
    CPC .............. H03F 1/301 (2013.01); H03F 1/56 (2013.01); H03F 3/211 (2013.01); *H03F 2200/21* (2013.01); *H03F 2200/222* (2013.01); *H03F 2200/387* (2013.01); *H03F 2200/451* (2013.01)

(58) Field of Classification Search
    CPC . H03F 1/301; H03F 1/56; H03F 3/211; H03F 2200/21; H03F 2200/222; H03F 2200/387; H03F 2200/451
    USPC ......................................................... 330/296
    See application file for complete search history.

(56) References Cited

U.S. PATENT DOCUMENTS

| | | | |
|---|---|---|---|
| 4,929,907 A | 5/1990 | Berkel | |
| 9,543,901 B2 | 1/2017 | Nobbe et al. | |
| 9,768,743 B1 | 9/2017 | Tam et al. | |
| 9,843,293 B1 * | 12/2017 | Wagh | H03F 1/0211 |
| 10,756,678 B2 * | 8/2020 | Klaren | H03F 3/193 |
| 11,128,261 B2 | 9/2021 | Ranta et al. | |
| 11,601,094 B2 | 3/2023 | Klaren et al. | |
| 2016/0126901 A1 | 5/2016 | Knopik | |
| 2019/0158029 A1 | 5/2019 | Wagh et al. | |

(Continued)

OTHER PUBLICATIONS

Dubret, Francoise, International Search Report and Written Opinion received from the EPO dated Jul. 24, 24 for appln. No. PCT/JP2024/016173, 18 pgs.

*Primary Examiner* — Hafizur Rahman
(74) *Attorney, Agent, or Firm* — Steinfl + Bruno LLP

(57) ABSTRACT

Stacked amplifier architectures that have bias circuits that are tolerant of supply voltage variations, which provide good reliability, are fast to follow $V_{CC}$ changes, and exhibit small variations in gain as $V_{CC}$ varies. One embodiment encompasses a bias circuit for an amplifier stack, including a source follower circuit configured to output a bias voltage to a transistor within the amplifier stack and configured to be coupled to a variable voltage, and a controller coupled to the source follower circuit, configured to be coupled to a constant voltage, and configured to apply a constant voltage to the source follower circuit. The source follower circuit generates a reference voltage and (1) outputs a constant bias voltage when the variable voltage is above the reference voltage, and (2) outputs a bias voltage proportional to the variable voltage when the variable voltage is below the reference voltage.

19 Claims, 16 Drawing Sheets

(56) References Cited

U.S. PATENT DOCUMENTS

| 2019/0190459 A1* | 6/2019 | Wagh ...................... H03F 1/223 |
| 2020/0127622 A1* | 4/2020 | Matsumoto ............... H03F 1/22 |

\* cited by examiner

*1200*

1800

1808

1808

1806

1810

1814

Base Station
Transceiver

1812

Transceiver
Node

1816

Switching
Center

Network
Center

1802

1804

_2000_

Applying a constant control voltage to a source follower circuit coupled to a variable voltage source ⟶ 2002

Generating a bias voltage within the source follower circuit ⟶ 2004

Applying the generated bias volage to a gate of the FET ⟶ 2006

BIAS CIRCUIT FOR STACKED POWER AMPLIFIERS WITH A VARIABLE POWER SUPPLY

BACKGROUND

(1) Technical Field

The invention relates to electronic circuits, and more particularly to bias circuits for power amplifiers.

(2) Background

Amplifiers are a common component in electronic circuits, particularly in radio frequency (RF) transmitters and receivers. For many RF systems, particularly those requiring portability (e.g., cellular telephones, WiFi-connected computers, cameras, and other devices, etc.), it has become common to use complementary metal-oxide-semiconductor (CMOS) fabrication technology to create low cost, low power, complex integrated circuits (ICs) containing multiple field-effect transistors (FETs).

FIG. 1 is a simplified schematic diagram of a first prior art amplifier circuit 100. The illustrated circuit 100 has a cascode common source architecture constructed from an amplifier stack 102 comprising at least two series-connected FETs M1-Mn, where n≥2. An input signal may be applied through an input port $P_{IN}$ coupled through an input impedance matching network 104 to the gate of a first or bottom FET M1 FET within the amplifier stack 102. The gate of FET M1 is also coupled to a voltage source Vg1_bias 106 through a resistor Rg1. The drain of FET M1 is coupled to (and thus drives) the source of a second FET M2. The source of MI is coupled to RF ground (in some embodiments, through a degeneration inductor circuit, not shown).

Each FET in the stack above FET M1 has a source coupled to a lower-numbered FET and a drain coupled to a higher-numbered FET (except for the last or top FET Mn). The drain of FET Mn provides an amplified output signal to an output load and impedance matching network 108, which provides a modified amplified output signal at an output port $P_{OUT}$. Power is supplied to the amplifier circuit 100 from a DC voltage source $V_{CC}$.

Each FET M2-Mn includes a respective gate resistor Rg2-Rgn, each of which is coupled to a respective node within a bias circuit 110 comprising a resistive ladder of bias resistors Rb1-Rbn series-connected between $V_{CC}$ and circuit ground. The bias circuit 110 in combination with the gate resistors Rg2-Rgn provide respective voltages Vg2-Vgn to the FETs M2-Mn.

FIG. 2 is a simplified schematic diagram of a second prior art amplifier circuit 200. Similar in most aspects to the amplifier circuit 100 of FIG. 1, the bias circuit 110 is connected between a constant voltage source $V_{CON}$ (rather than $V_{CC}$) and circuit ground.

While the cascode circuits 100, 200 illustrated in FIGS. 1 and 2 provide good isolation because there is no direct coupling from the input to the output, the circuits are not well suited to applications in which the DC supply voltage $V_{CC}$ varies, such as when a battery loses power over time or in applications where the DC supply voltage at the drain of FET Mn is actively modified to optimize operation at different power levels; examples include average power tracking (APT), envelope tracking (ET), and GSM amplifier power control. In these examples, the supply voltage $V_{CC}$ may have a range that varies by a factor of 10 or more (e.g., from 4.5V to 0.4V, as one example).

For example, FIG. 3 is a graph of gate voltage (Vg) as a function of $V_{CC}$ for two FETs M2, M5 in an embodiment of the prior art amplifier circuit 100 of FIG. 1 in which n=5 for the amplifier stack 102. As shown, the gate voltages Vg2 and Vg5 for the selected FETs vary directly with changes in $V_{CC}$ (the gate voltages Vg3 and Vg4 would be intermediate between Vg2 and Vg5). This behavior provides good reliability by keeping the gate-to-drain voltage $V_{GD}$ for each FET in the amplifier stack 102 small across variations of $V_{CC}$, and the amplifier circuit 100 responds quickly to variations in $V_{CC}$, which is good for such applications as envelope tracking. However, the amplifier circuit 100 exhibits a large variation in gain between high values of $V_{CC}$ and mid-to-low values of $V_{CC}$ (see also FIG. 8 below).

As another example, FIG. 4 is a graph of Vg as a function of $V_{CC}$ for two FETs M2, M5 in an embodiment of the prior art amplifier circuit 200 of FIG. 2 in which n=5 for the amplifier stack 102. As shown, the gate voltages Vg2 and Vg5 for the selected FETs are essentially constant with respect to variations in $V_{CC}$ (the gate voltages Vg3 and Vg4 would be intermediate between Vg2 and Vg5). This behavior essentially eliminates large variations in gain as $V_{CC}$ varies, and the amplifier circuit 200 responds quickly to variations in $V_{CC}$. However, the amplifier circuit 200 exhibits bad reliability, since the difference between a constant Vg5 (e.g., 4.5V) and a low value of $V_{CC}$ (e.g., 2.0V) may cause the $V_{GD}$ for FET M5 (2.5V in this example) to exceed the design capability of the FET, possibly leading to device failure.

Other bias circuits 110 have been proposed that exhibit small variations in gain between high values of $V_{CC}$ and mid-to-low values of $V_{CC}$ and good reliability (small $V_{GD}$ even at low values of $V_{CC}$), but which are slow to follow $V_{CC}$ changes.

Accordingly, there is a need for bias circuits for stacked amplifier architectures that are tolerant of supply voltage variations, which provide good reliability (small $V_{GD}$ even at low values of $V_{CC}$), are fast to follow $V_{CC}$ changes, and exhibit small variations in gain between high values of $V_{CC}$ and mid-to-low values of $V_{CC}$. The present invention addresses this need.

SUMMARY

The present invention encompasses stacked amplifier architectures that have bias circuits that are tolerant of supply voltage variations, which provide good reliability (small $V_{GD}$ even at low values of $V_{CC}$), are fast to follow $V_{CC}$ changes, and exhibit small variations in gain between high values of $V_{CC}$ and mid-to-low values of $V_{CC}$.

One embodiment encompasses a bias circuit for an amplifier stack, the bias circuit including a source follower circuit configured to output a bias voltage when coupled to a gate of a transistor within the amplifier stack, the source follower circuit configured to be coupled to a variable voltage source for the amplifier stack, and a controller coupled to the source follower circuit, configured to be coupled to a constant voltage source, and configured to apply a constant voltage to the source follower circuit. In one aspect, the source follower circuit generates a gate reference voltage and (1) outputs a constant bias voltage when a voltage of the variable voltage source is above the gate reference voltage, and (2) outputs a bias voltage proportional to the voltage of the variable voltage source when the voltage of the variable voltage source is below the gate reference voltage.

The details of one or more embodiments of the invention are set forth in the accompanying drawings and the description below. Other features, objects, and advantages of the invention should be apparent from the description and drawings, and from the claims.

DESCRIPTION OF THE DRAWINGS

Like reference numbers and designations in the various drawings indicate like elements unless the context requires otherwise.

DETAILED DESCRIPTION

The present invention encompasses stacked amplifier architectures that have bias circuits that are tolerant of supply voltage variations, which provide good reliability (small $V_{GD}$ even at low values of $V_{CC}$), are fast to follow $V_{CC}$ changes, and exhibit small variations in gain between high values of $V_{CC}$ and mid-to-low values of $V_{CC}$.

First Example Embodiment

Figure 5:
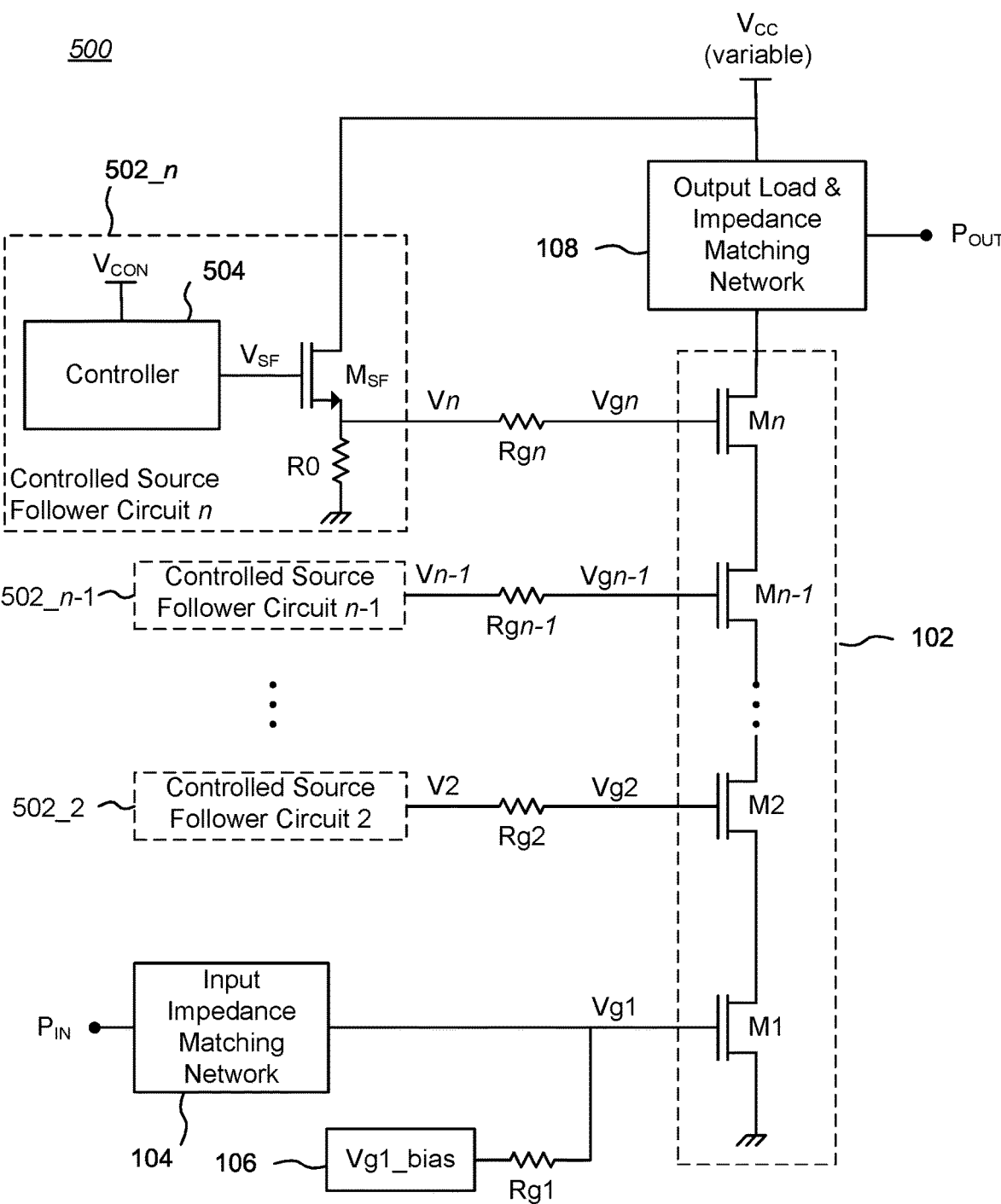
FIG. 5 is a simplified schematic diagram of a first amplifier circuit in accordance with the present invention.

FIG. 5 is a simplified schematic diagram of a first amplifier circuit 500 in accordance with the present invention. The illustrated circuit 500 has a cascode common source architecture constructed from an amplifier stack 102 comprising at least two series-connected FETs M1-Mn, where n≥2. An input signal may be applied through an input port $P_{IN}$ coupled through an input impedance matching network 104 to the gate of FET M1. The gate of FET M1 is also coupled to a voltage source Vg1_bias 106 through a resistor Rg1. The drain of FET M1 is coupled to (and thus drives) the source of a second FET M2. The source of MI is coupled to RF ground (in some embodiments, through a degeneration inductor circuit, not shown).

Each FET in the stack above FET M1 has a source coupled to a lower-numbered FET and a drain coupled to a higher-numbered FET (except for FET Mn). The drain of FET Mn provides an amplified output signal to an output load and impedance matching network 108, which provides a modified amplified output signal at an output port $P_{OUT}$. Power is supplied to the amplifier circuit 100 from a DC voltage source $V_{CC}$, which may be variable.

In the illustrated example, each FET M2-Mn includes a respective gate resistor Rg2-Rgn, each of which is coupled to a respective controlled source follower (CSF) circuit 502-2 to 502_n (generically, 502_x). The CSF circuits 502_x in combination with the gate resistors Rg2-Rgn provides respective voltages Vg2-Vgn to the FETs M2-Mn.

Each CSF circuit 502_x includes a source follower FET $M_{SF}$ having a conduction channel (drain to source) coupled between $V_{CC}$ and a resistor R0. Resistor R0 in turn is coupled to a reference potential (e.g., circuit ground). The gate of FET $M_{SF}$ is coupled to a controller 504 which is supplied by a constant voltage source $V_{CON}$ and is configured to generate an essentially constant voltage $V_{SF}$ for the gate of the source follower FET $M_{SF}$. As one example, $V_{CON}$ may be supplied from an external battery, such as a battery having a voltage of about 3.8V. Each CSF circuit 502_x outputs a corresponding voltage Vx to respective gate resistor Rg2-Rgn from a node between resistor R0 and the FET $M_{SF}$. The CSF circuits 502_x in combination with the gate resistors Rg2-Rgn provide respective voltages Vg2-Vgn to the FETs M2-Mn. In some embodiments, the controller 504 may include temperature compensation to provide higher voltages Vg2-Vgn at higher temperatures.

Figure 6:
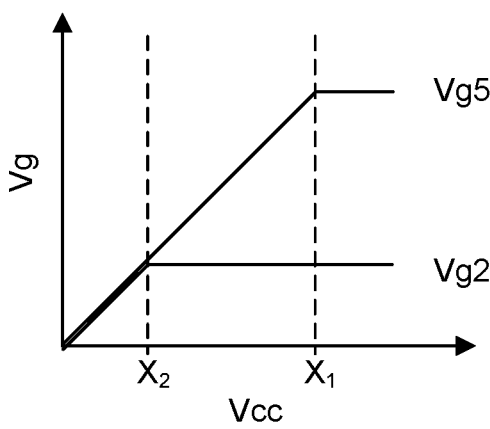
FIG. 6 is a graph of Vg as a function of $V_{CC}$ for two FETs M2, M5 in an embodiment of the novel amplifier circuit of FIG. 5, in which n=5 for the amplifier stack.

FIG. 6 is a graph of Vg as a function of $V_{CC}$ for two FETs M2, M5 in an embodiment of the novel amplifier circuit 500 of FIG. 5, in which n=5 for the amplifier stack 102. Above a value $X_1$ for $V_{CC}$, Vg2 and Vg5 are constant. Between mid-range values $X_2$ and $X_1$ for $V_{CC}$, Vg2 remains constant but Vg5 varies directly (linearly) with $V_{CC}$. Below value $X_2$, both Vg2 and Vg5 vary directly with $V_{CC}$. The gate voltages Vg3 and Vg4 would correspond to similar "kinked" graph lines intermediate between Vg2 and Vg5, with the inflection point of each being between $X_2$ and $X_1$. Thus, each CSF circuit 502_x is configured to keep its corresponding Vgx value at a preferred design level at high values of $V_{CC}$, thus providing for small variations in gain, but also not allowing for its corresponding Vgx value to be higher than $V_{CC}$ at lower values of $V_{CC}$, thus providing good reliability.

Figure 7:
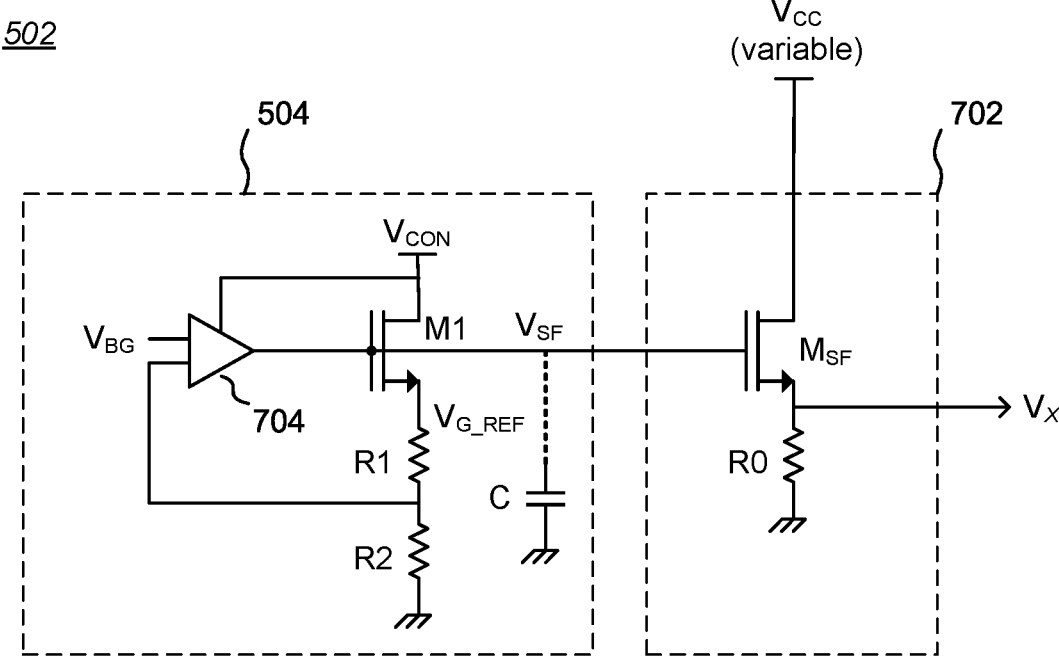
FIG. 7 is a schematic diagram of one embodiment of a controlled source follower circuit.

FIG. 7 is a schematic diagram of one embodiment of a controlled source follower circuit 502. Each CSF circuit 502_x includes a source follower circuit 702 comprising a source follower FET $M_{SF}$ having a conduction channel coupled between $V_{CC}$ and a resistor R0, which in turn is coupled to a reference potential. In the illustrated example, the controller 504 includes a FET M1 having a conduction channel coupled between $V_{CON}$ and a resistor R1. Resistor R1 is coupled in series with resistor R2, which in turn is coupled to the reference potential. In an illustrative embodiment, FET M1 and the source follower FET $M_{SF}$ may be of the same size, R3 may equal R1+R2, and R1 may equal R2.

A node between resistors R1 and R2 is coupled to a first input of an opamp 704. A second input of the opamp 704 is coupled to a bandgap reference voltage $V_{BG}$ in this example ($V_{BG}$ is typically about 1.2V). The internal circuitry of the opamp 704 is powered by $V_{CON}$. The output of the opamp 704 is coupled to the gate of FET M1 and to the gate of the source follower FET $M_{SF}$. Thus, the resistor ladder comprising R1 and R2, in conjunction with the opamp 704, provide a feedback circuit from the source of FET M1 to the gate of FET M1. In some embodiments, an optional capacitor C may be coupled to the gate of the source follower FET $M_{SF}$ to protect against RF signal leakage via parasitic IC components from the amplifier stack 102 FET Mx to the gate of the source follower FET $M_{SF}$.

In operation, the example controller 504 maintains a constant gate reference voltage $V_{G\_REF}$ between the source of FET M1 and resistor R1, and a constant gate voltage $V_{SF}$ for the gate of the source follower FET $M_{SF}$. At values of $V_{CC}$ at or greater than $V_{G\_REF}$, the output voltage Vx from the source follower circuit 702 (which generates the gate voltage Vgx for the corresponding FET Mx) is constant and equal to $V_{G\_REF}$. However, at values of $V_{CC}$ less than $V_{G\_REF}$, the output voltage Vx from the source follower circuit 702 varies with and is equal to $V_{CC}$. since Vx cannot be higher than its supply voltage $V_{CC}$. Note that as $V_{CC}$ becomes very low, Vx becomes low and almost the same as $V_{CC}$. In such a case, the $V_{DS}$ of FET $M_{SF}$ is almost 0V and the $V_{GS}$ of FET $M_{SF}$ is high (because the source voltage Vx is low), and accordingly the FET $M_{SF}$ performs as a switch in the ON state and the conductivity is high. The result is that the CSF circuit 502_x causes Vgx to behave like the "kinked" graph lines shown in FIG. 6 as a function of the value of $V_{CC}$.

As should be appreciated, other circuitry may be used for the controller 504 in order to generate a constant gate voltage $V_{SF}$ for the gate of the source follower FET $M_{SF}$.

Comparison of Embodiments

Figure 1:
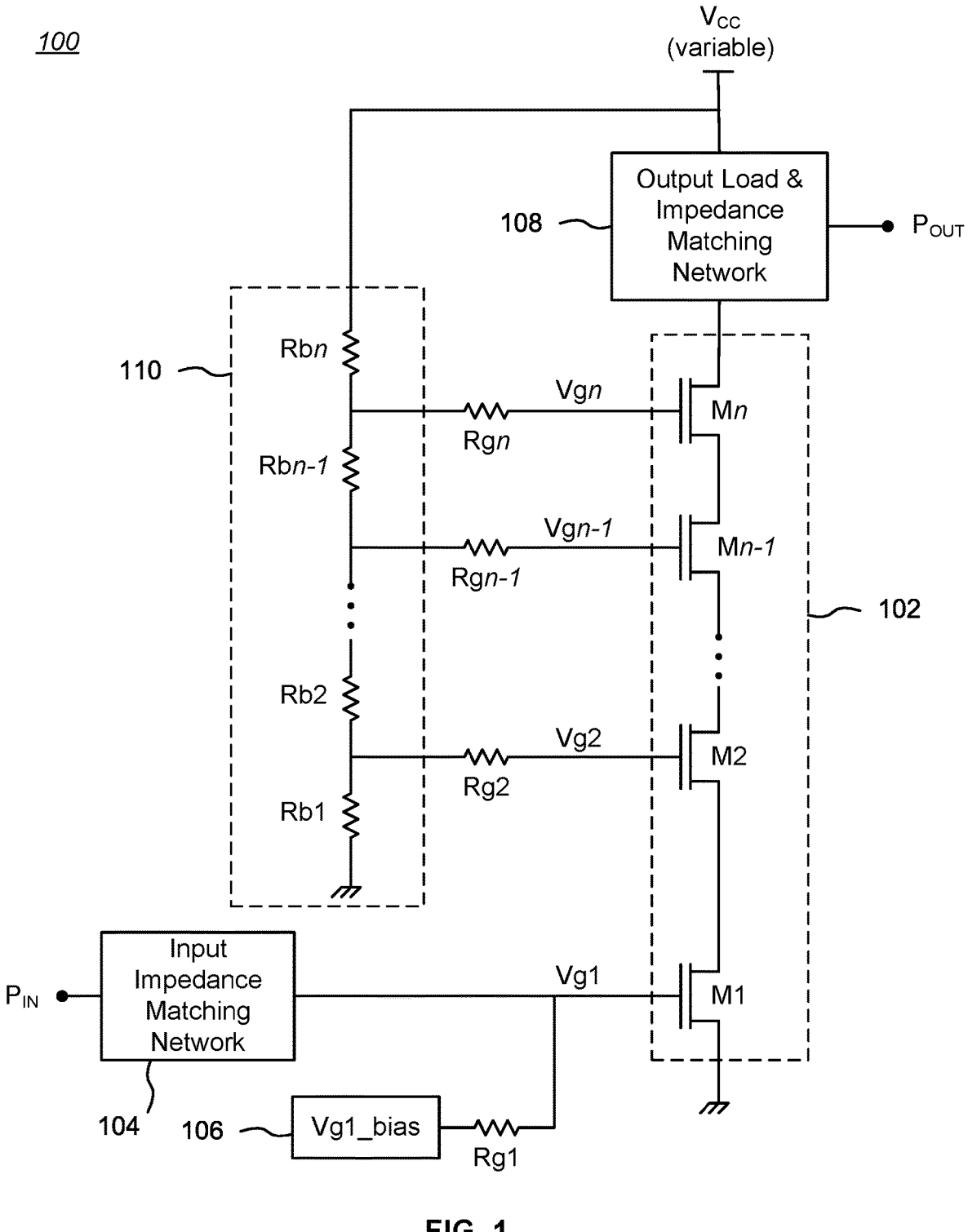
FIG. 1 is a simplified schematic diagram of a first prior art amplifier circuit.
Figure 2:
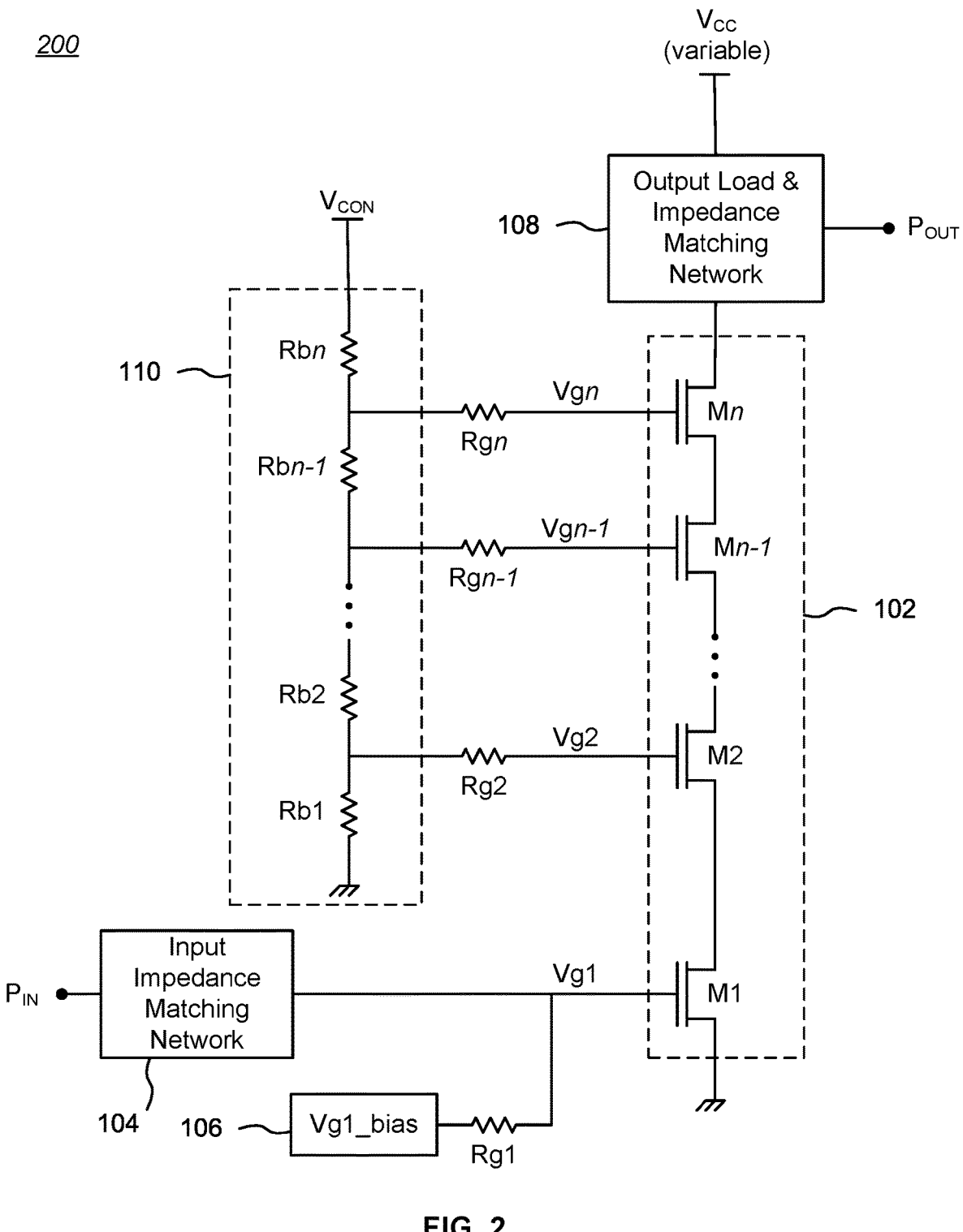
FIG. 2 is a simplified schematic diagram of a second prior art amplifier circuit.
Figure 3:
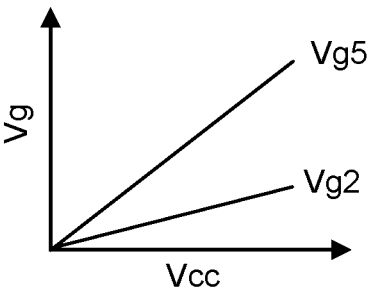
FIG. 3 is a graph of gate voltage (Vg) as a function of $V_{CC}$ for two FETs M2, M5 in an embodiment of the prior art amplifier circuit of FIG. 1 in which n=5 for the amplifier stack.
Figure 4:
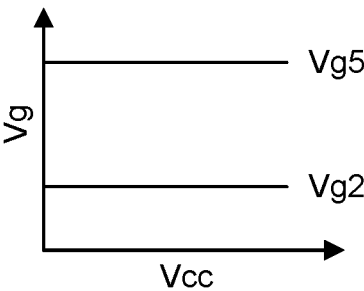
FIG. 4 is a graph of Vg as a function of $V_{CC}$ for two FETs M2, M5 in an embodiment of the prior art amplifier circuit of FIG. 2 in which n=5 for the amplifier stack.
Figure 8:
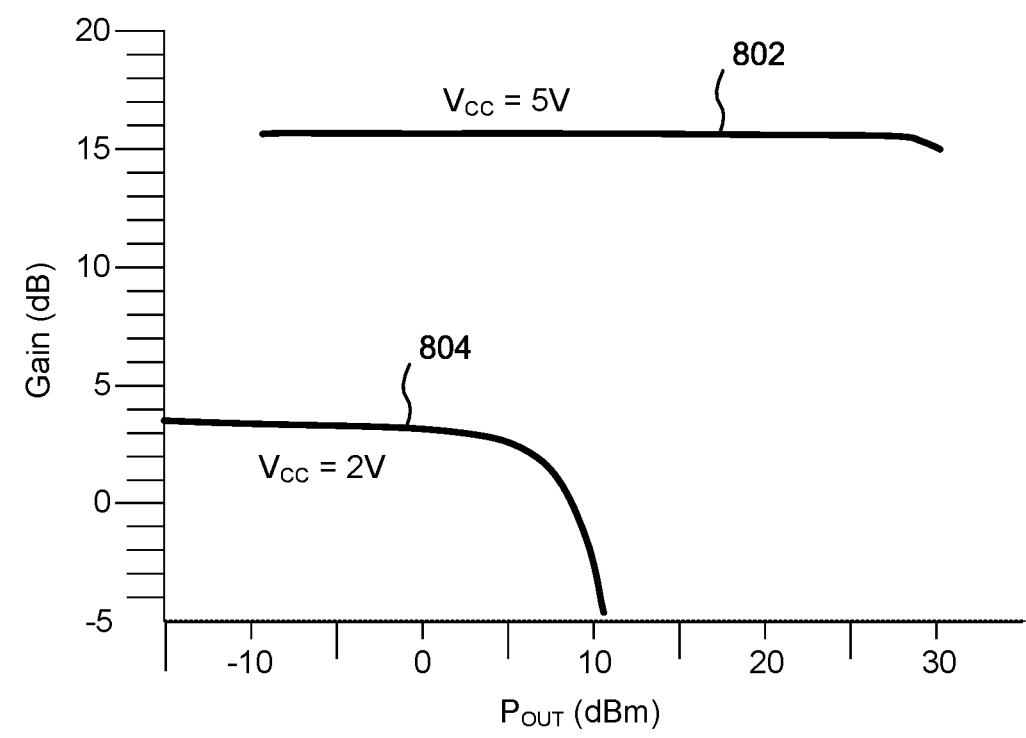
FIG. 8 is a graph of gain as a function of output power for a modeled embodiment of the amplifier circuit of FIG. 1 having a resistive-ladder bias circuit coupled to $V_{CC}$.

FIG. 8 is a graph 800 of gain as a function of output power for a modeled embodiment of the amplifier circuit 100 of FIG. 1 having a resistive-ladder bias circuit 110 coupled to $V_{CC}$. Graph line 802 corresponds to a $V_{CC}$ value of 5V, and graph line 804 corresponds to a $V_{CC}$ value of 2V.

Figure 9:
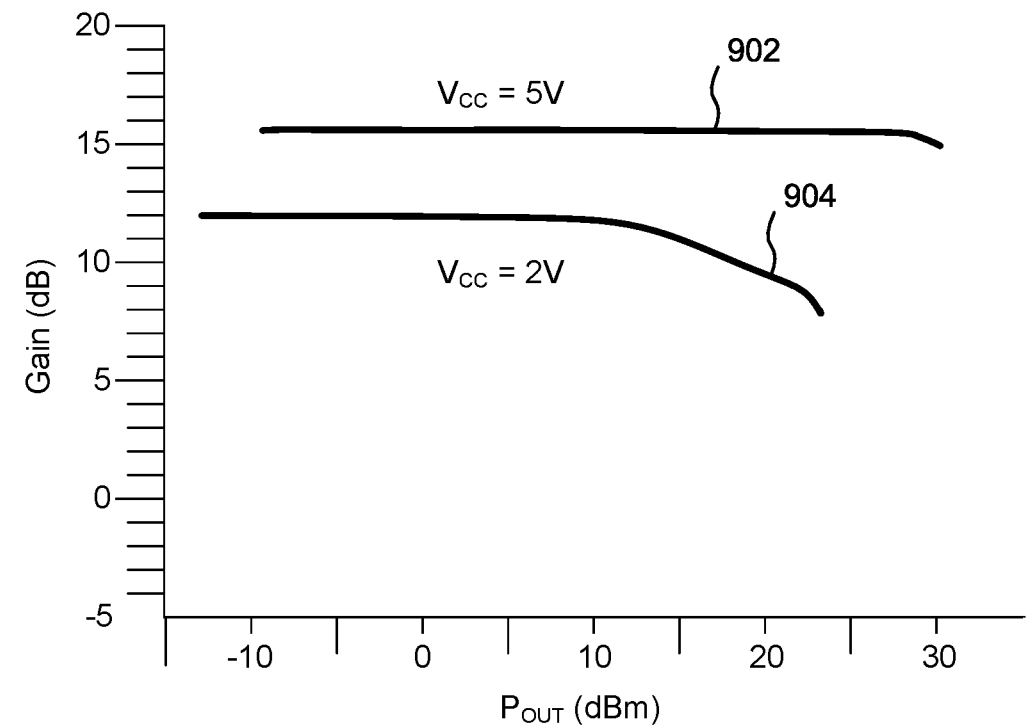
FIG. 9 is a graph of gain as a function of output power for a modeled embodiment of the novel amplifier circuit of FIG. 5 having a controlled source follower circuit using the controller of FIG. 7.

FIG. 9 is a graph 900 of gain as a function of output power for a modeled embodiment of the novel amplifier circuit 500 of FIG. 5 having a controlled source follower circuit 502 using the controller 504 of FIG. 7. Graph line 902 corresponds to a $V_{CC}$ value of 5V, and graph line 904 corresponds to a $V_{CC}$ value of 2V.

As a comparison of graph 800 to graph 900 shows, a drop in $V_{CC}$ from 5V to 2V causes a very large drop in gain for the amplifier circuit 100 of FIG. 1, while the amplifier circuit 500 of FIG. 5 has a much lesser drop in. The difference in the two graphs 800, 900 is due to the use of CSF circuits 502_x rather than a resistive-ladder bias circuit 110 coupled to $V_{CC}$.

Figure 10:
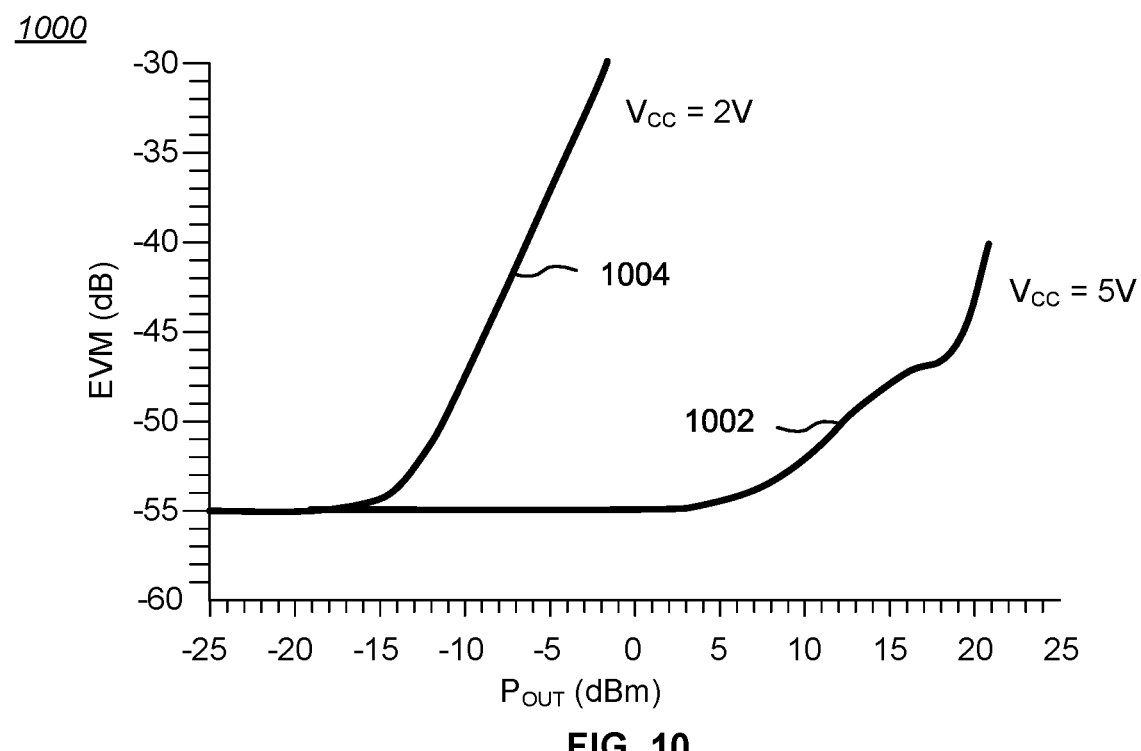
FIG. 10 is a graph of error vector magnitude (EVM) as a function of output power for a modeled embodiment of the amplifier circuit of FIG. 1 having a resistive-ladder bias circuit coupled to $V_{CC}$.

FIG. 10 is a graph 1000 of error vector magnitude (EVM) as a function of output power for a modeled embodiment of the amplifier circuit 100 of FIG. 1 having a resistive-ladder bias circuit 110 coupled to $V_{CC}$. Graph line 1002 corresponds to a $V_{CC}$ value of 5V, and graph line 1004 corresponds to a $V_{CC}$ value of 2V. EVM is commonly used to characterize the level of distortion introduced by a power amplifier.

Figure 11:
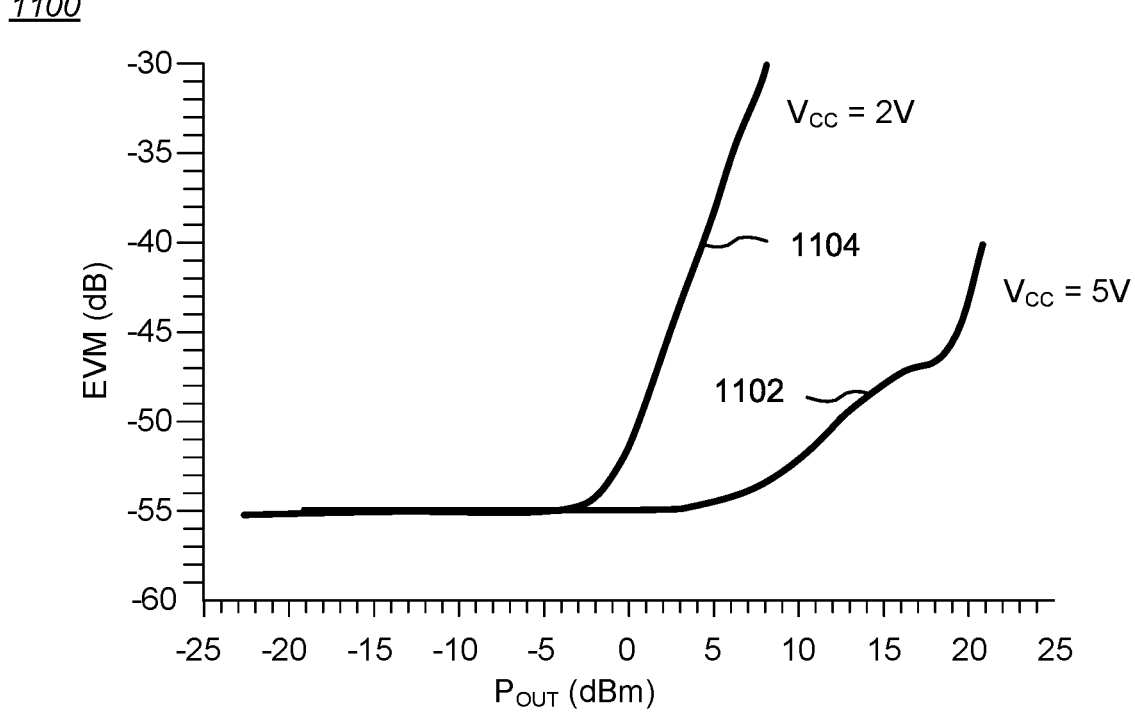
FIG. 11 is a graph of EVM as a function of output power for a modeled embodiment of the novel amplifier circuit of FIG. 5 having a controlled source follower circuit using the controller of FIG. 7.

FIG. 11 is a graph 1100 of EVM as a function of output power for a modeled embodiment of the novel amplifier circuit 500 of FIG. 5 having a controlled source follower circuit 502 using the controller 504 of FIG. 7. Graph line 1102 corresponds to a $V_{CC}$ value of 5V, and graph line 1104 corresponds to a $V_{CC}$ value of 2V.

As a comparison of graph 1000 to graph 1100 shows, a drop in $V_{CC}$ from 5V to 2V causes the EVM to increase dramatically at a much lower power output for the amplifier circuit 100 of FIG. 1, while the amplifier circuit 500 of FIG. 5 has a much lesser difference between the EVM at 2V and 5V. Again, the difference in the two graphs 1000, 1100 is due to the use of CSF circuits 502_x rather than a resistive-ladder bias circuit 110 coupled to $V_{CC}$.

Alternative Embodiments

Figure 12:
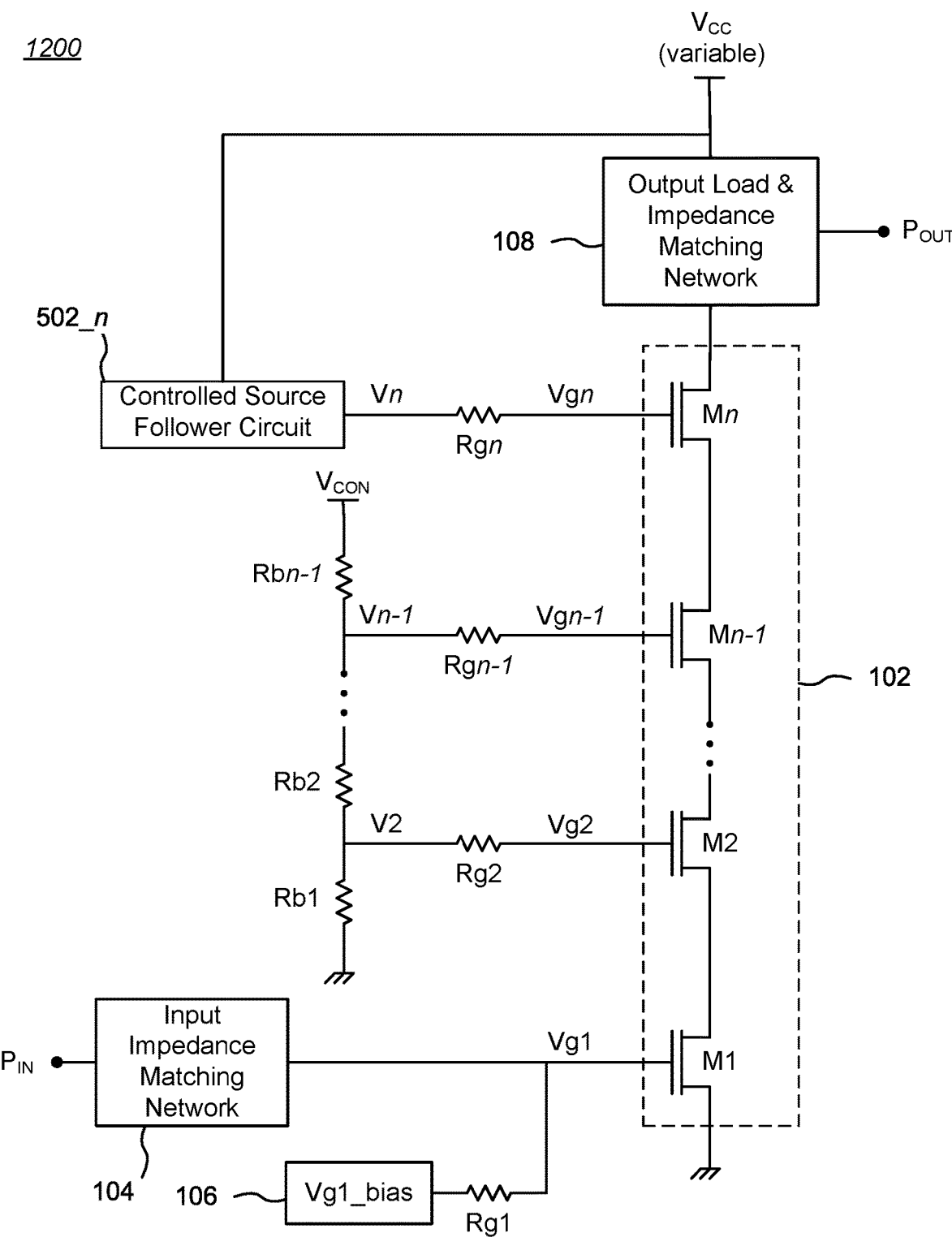
FIG. 12 is a schematic diagram of an amplifier in which a CSF circuit is used as the bias circuit for only the top FET Mn.

A number of alternative embodiments may beneficially use a CSF circuit 502_x as the bias circuit for one or more FETs M2-Mn within an amplifier stack 102. For example, the top FET Mn in an amplifier stack 102 is most susceptible to potential damage due to low values of $V_{CC}$. and accordingly benefits most from the use of a CSF circuit 502_x. As an example, FIG. 12 is a schematic diagram of an amplifier 1200 in which a CSF circuit 502_n is used as the bias circuit for only the top FET Mn. In the illustrated example, a resistive ladder powered by $V_{CON}$ may be used to bias FETs M2-Mn-1, but other circuits may be used to provide bias voltages to one or more of those FETs (e.g., a resistive ladder powered by $V_{CC}$). As should be appreciated, a CSF circuit 502_x may be used as the bias circuit for two or more of the upper FETs within an amplifier stack 102, while other circuits (e.g., a resistive ladder powered by $V_{CON}$ or $V_{CC}$) may be used to bias lower FETs.

Figure 13:
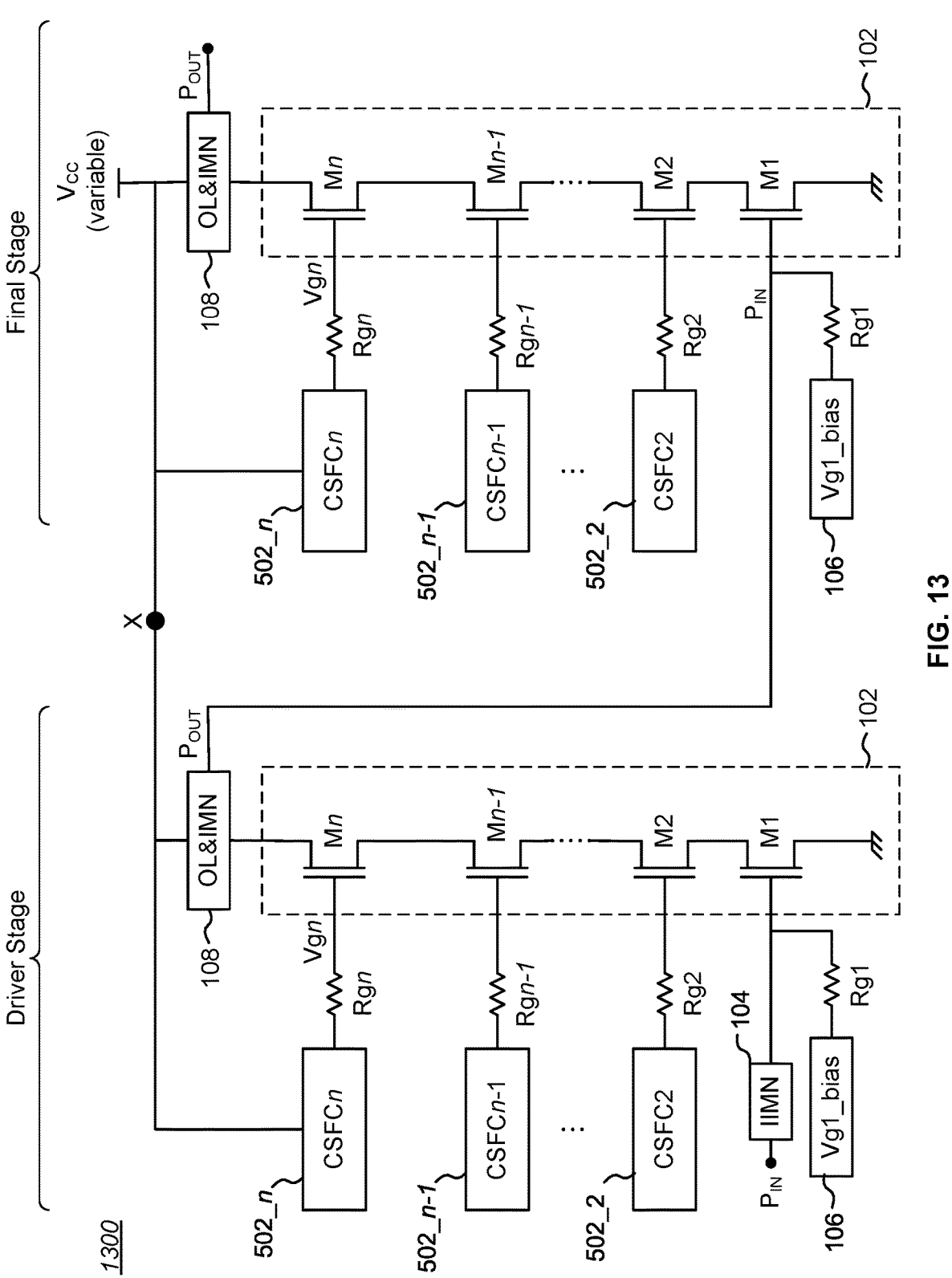
FIG. 13 is a schematic diagram of a dual-stage amplifier utilizing CSF circuits as bias circuits.

Power amplifiers that use a CSF circuit 502_x as the bias circuit for one or more FETs M2-Mn within an amplifier stack 102 may be concatenated to provide greater signal amplification. For example, FIG. 13 is a schematic diagram of a dual-stage amplifier 1300 utilizing CSF circuits 502_x as bias circuits. A signal applied at the $P_{IN}$ port of a Driver Stage is output as a first amplified signal at the $P_{OUT}$ port of the first Driver Stage. The first amplified signal is applied to the $P_{IN}$ port of a Final Stage and is output as a second amplified signal at the $P_{OUT}$ port of the Final Stage. In the illustrated example, the Final Stage need not have an input impedance matching network 104 since impedance matching may be accomplished in the output load and impedance matching network 108 of the Driver Stage. As should be appreciated, more than two amplifiers may be concatenated in a similar manner. In some applications, there may be a need to have the Driver Stage $V_{CC}$ and Final Stage $V_{CC}$ be separate and/or vary independently. Such embodiments would allow for independent $V_{CC}$ for the Driver Stage and Final Stage by breaking the connection at node X in FIG. 13, and connecting the stages to separate $V_{CC}$s.

Figure 14:
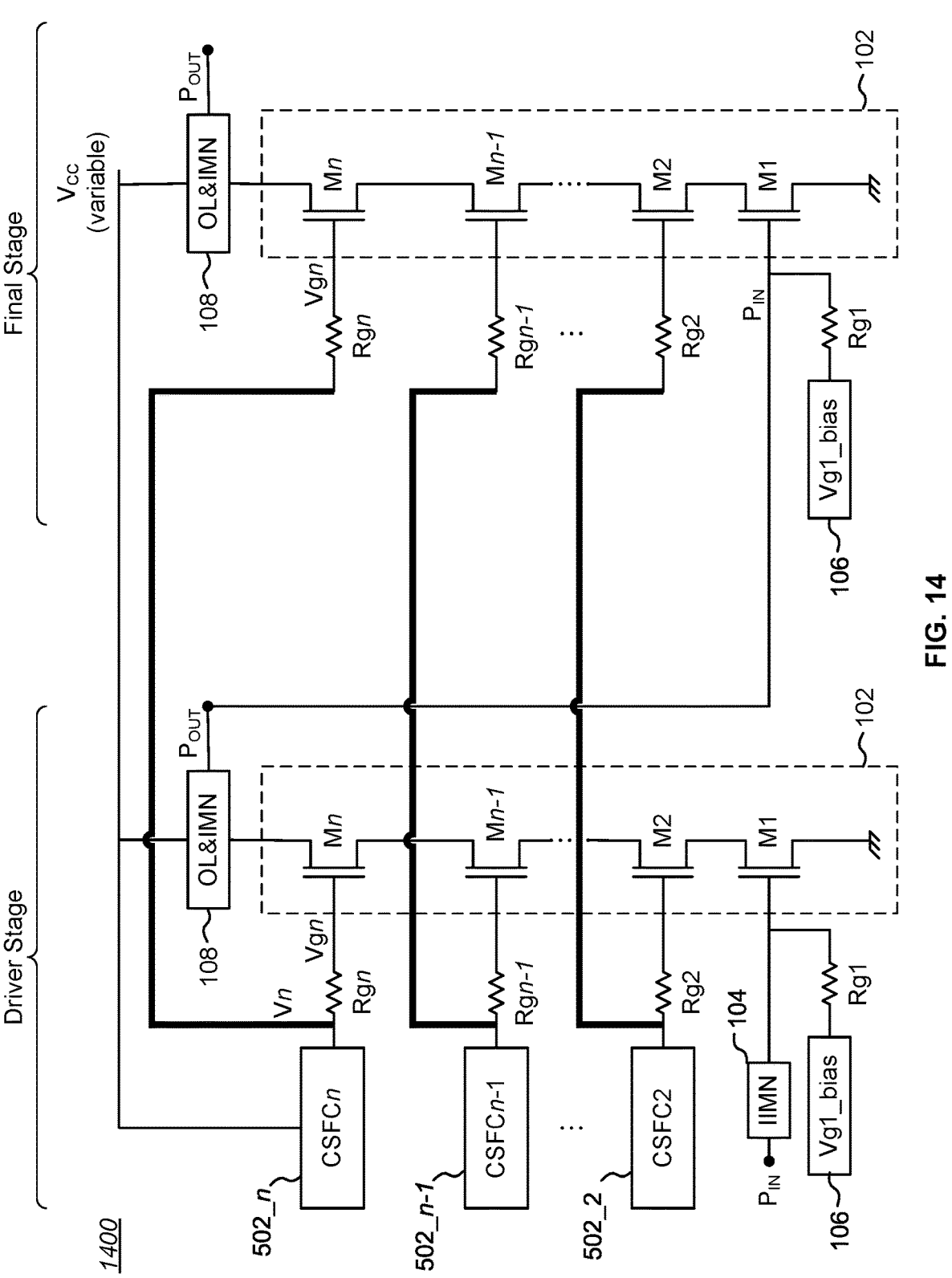
FIG. 14 is a schematic diagram of a dual-stage amplifier utilizing shared CSF circuits as bias circuits.

FIG. 14 is a schematic diagram of a dual-stage amplifier 1400 utilizing shared CSF circuits 502_$x$ as bias circuits. In the illustrated example, each FET M2-Mn within the amplifier stack 102 of a Driver Stage is biased by a corresponding CSF circuit 502_$x$. The output of each CSF circuit 502_$x$ is also coupled to the gate resistor Rg2-Rgn of a respective FET M2-Mn within the amplifier stack 102 of the Final Stage (see bolded connection lines). This configuration thus saves circuit area within an IC. As should be appreciated, more than two amplifiers may be concatenated in a similar manner and use shared CSF circuits 502_$x$ as bias circuits. Further, in some embodiments, shared CSF circuits 502_$x$ may be used as the bias circuit for one or more respective upper FETs within an amplifier stack 102, while other circuits (e.g., non-shared CSF circuits 502_$x$ or a resistive ladder powered by $V_{CON}$) may be used to bias lower FETs within the amplifier stack 102.

Figure 15:
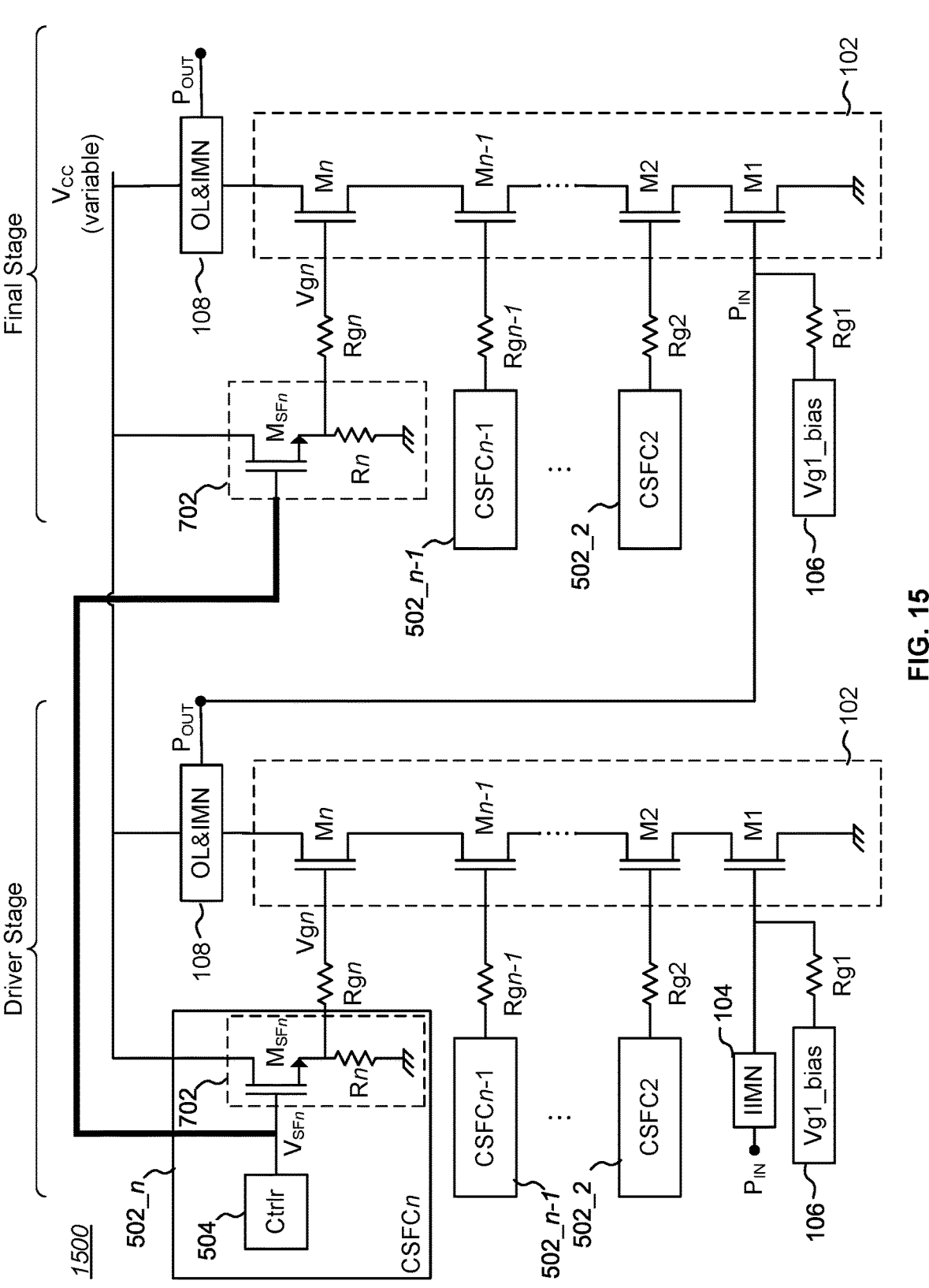
FIG. 15 is a schematic diagram of a dual-stage amplifier utilizing shared controllers as part of bias circuits for both stages.

FIG. 15 is a schematic diagram of a dual-stage amplifier 1400 utilizing shared controllers 504 as part of bias circuits for both stages. In the illustrated example, each FET M2-Mn within the amplifier stack 102 of a Driver Stage is biased by a corresponding CSF circuit 502_$x$. The top CSF circuit 502_$n$ is shown in greater detail, illustrating its constituent controller 504 (labelled "Ctrlr") and source follower circuit 702. The output of the controller 504 of CSF circuit 502_$n$ is coupled to a corresponding source follower circuit 702, which provides a bias voltage to the top FET Mn of the amplifier stack 102 of the Driver Stage. In addition, the output of the controller 504 of CSF circuit 502_$n$ of the Driver Stage is coupled (see bolded connection line) to a corresponding source follower circuit 702 in the Final Stage, which provides a bias voltage to the top FET Mn of the amplifier stack 102 of the Final Stage. This configuration also saves circuit area within an IC. As should be appreciated, more than two amplifiers may be concatenated in a similar manner and use shared controllers 504 as part of bias circuits for two or more stages. Further, in some embodiments, shared controllers 504 may be used as part of the bias circuits for one or more respective upper FETs within an amplifier stack 102, while other circuits (e.g., CSF circuits 502_$x$ within non-shared controllers 504 or a resistive ladder powered by $V_{CON}$) may be used to bias lower FETs within the amplifier stack 102.

Figure 16:
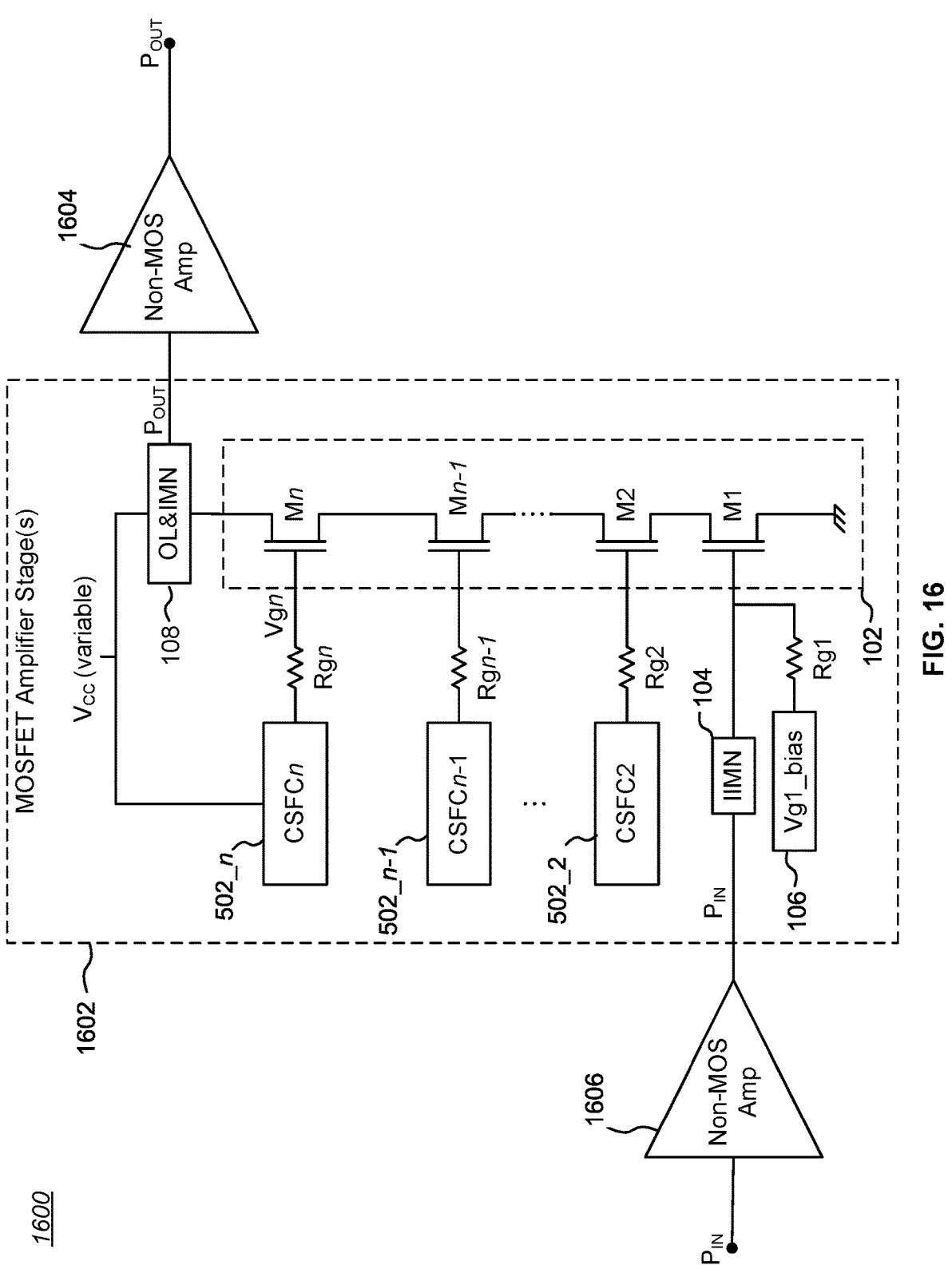
FIG. 16 is a block diagram of a hybrid amplifier. The hybrid amplifier includes a single-stage or multi-stage MOS-FET amplifier of any of the types described above that include one or more instances of a CSF circuit as a bias circuit.

FIG. 16 is a block diagram of a hybrid amplifier 1600. The hybrid amplifier 1600 includes a single-stage or multi-stage MOSFET amplifier 1602 of any of the types described above that include one or more instances of a CSF circuit 502_$x$ as a bias circuit. In a first configuration, a non-MOSFET amplifier 1604 based on a different fabrication technology (e.g., GaN, InP, SiGe, etc.) may coupled to the output port, $P_{OUT}$, of the MOSFET amplifier 1602. In a second configuration, a non-MOSFET amplifier 1606 based on a different fabrication technology (e.g., GaN, InP, SiGe, etc.) may coupled to the input port, $P_{IN}$, of the MOSFET amplifier 1602. In a third configuration, a non-MOSFET amplifier 1606 may coupled to the $P_{IN}$ port of the MOSFET amplifier 1602 and a non-MOSFET amplifier 1604 may coupled to the $P_{OUT}$ port of the MOSFET amplifier 1602. Note that the voltage supply ($V_{CC}$) to the non-MOSFET amplifiers 1604 and/or 1606 may operate independently at different levels and different variations from the $V_{CC}$ of the MOSFET amplifier 1602.

These configurations may be useful by combining less expensive MOSFET amplifier(s) 1602 with more expensive amplifiers that exhibit desired characteristics, such as better power efficiency and higher temperature operation at high gain and output power values (for a final stage) or low-noise amplification (for an initial stage).

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 17:
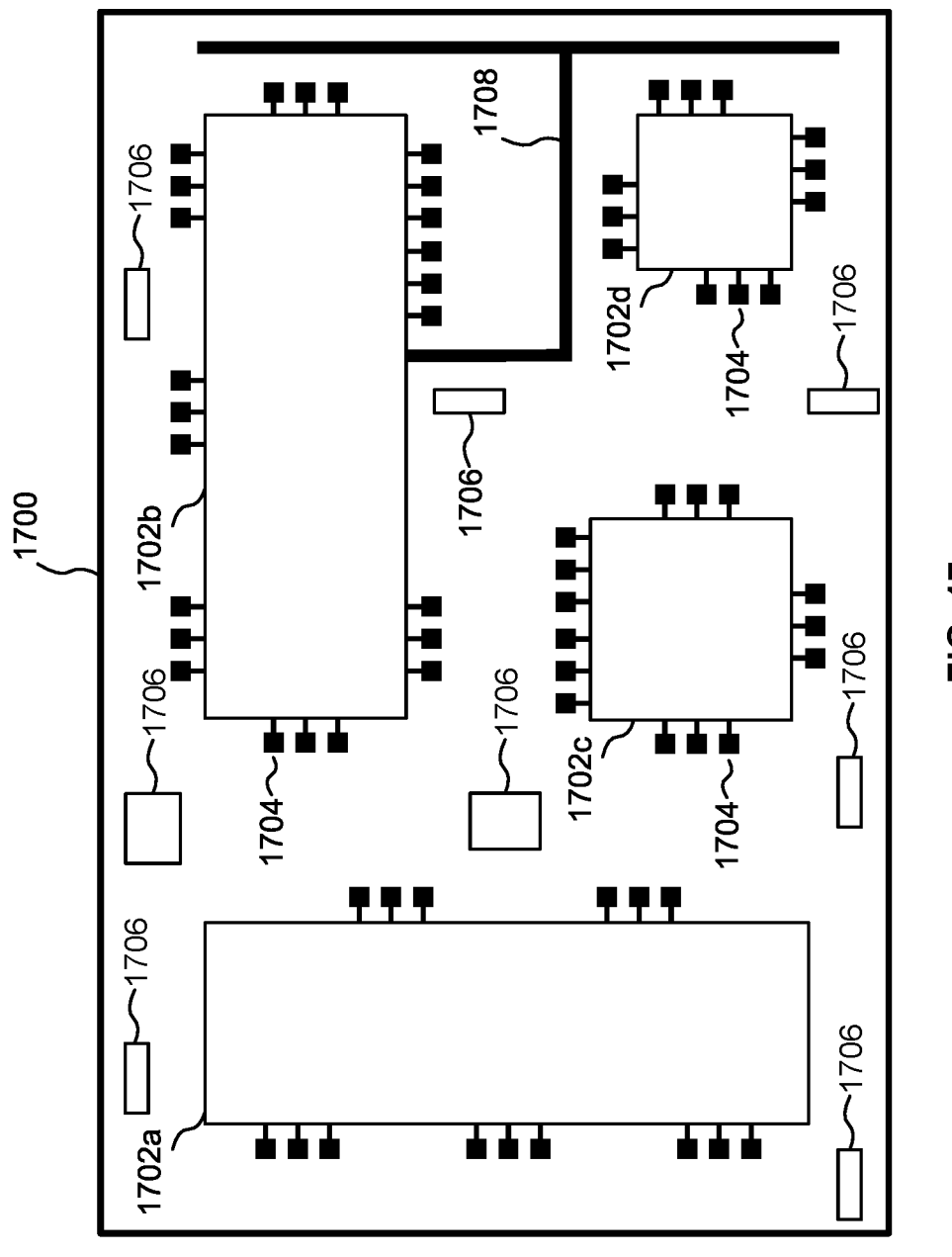
FIG. 17 is a top plan view of a substrate that may be, for example, a printed circuit board or chip module substrate (e.g., a thin-film tile).

As one example of further integration of embodiments of the present invention with other components, FIG. 17 is a top plan view of a substrate 1700 that may be, for example, a printed circuit board or chip module substrate (e.g., a thin-film tile). In the illustrated example, the substrate 1700 includes multiple ICs 1702a-1702d having terminal pads 1704 which would be interconnected by conductive vias and/or traces on and/or within the substrate 1700 or on the opposite (back) surface of the substrate 1700 (to avoid clutter, the surface conductive traces are not shown and not all terminal pads are labelled). The ICs 1702a-1702d may embody, for example, signal switches, active and/or passive filters, amplifiers (including one or more LNAs), and other circuitry. For example, IC 1702b may incorporate one or more instances of an amplifier biased by a controlled source follower circuit.

The substrate 1700 may also include one or more passive devices 1706 embedded in, formed on, and/or affixed to the substrate 1700. While shown as generic rectangles, the passive devices 1706 may be, for example, filters, capacitors, inductors, transmission lines, resistors, antennae elements, transducers (including, for example, MEMS-based transducers, such as accelerometers, gyroscopes, microphones, pressure sensors, etc.), batteries, etc., interconnected by conductive traces on or in the substrate 1700 to other passive devices 1706 and/or the individual ICs 1702a-1702d.

The front or back surface of the substrate 1700 may be used as a location for the formation of other structures. For example, one or more antennae may be formed on or affixed to the front or back surface of the substrate 1700; one example of a front-surface antenna 1708 is shown, coupled to an IC die 1702b, which may include RF front-end circuitry. Thus, by including one or more antennae on the substrate 1700, a complete radio may be created.

System Aspects

Embodiments of the present invention are useful in a wide variety of larger radio frequency (RF) circuits and systems for performing a range of functions, including (but not limited to) radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Figure 18:
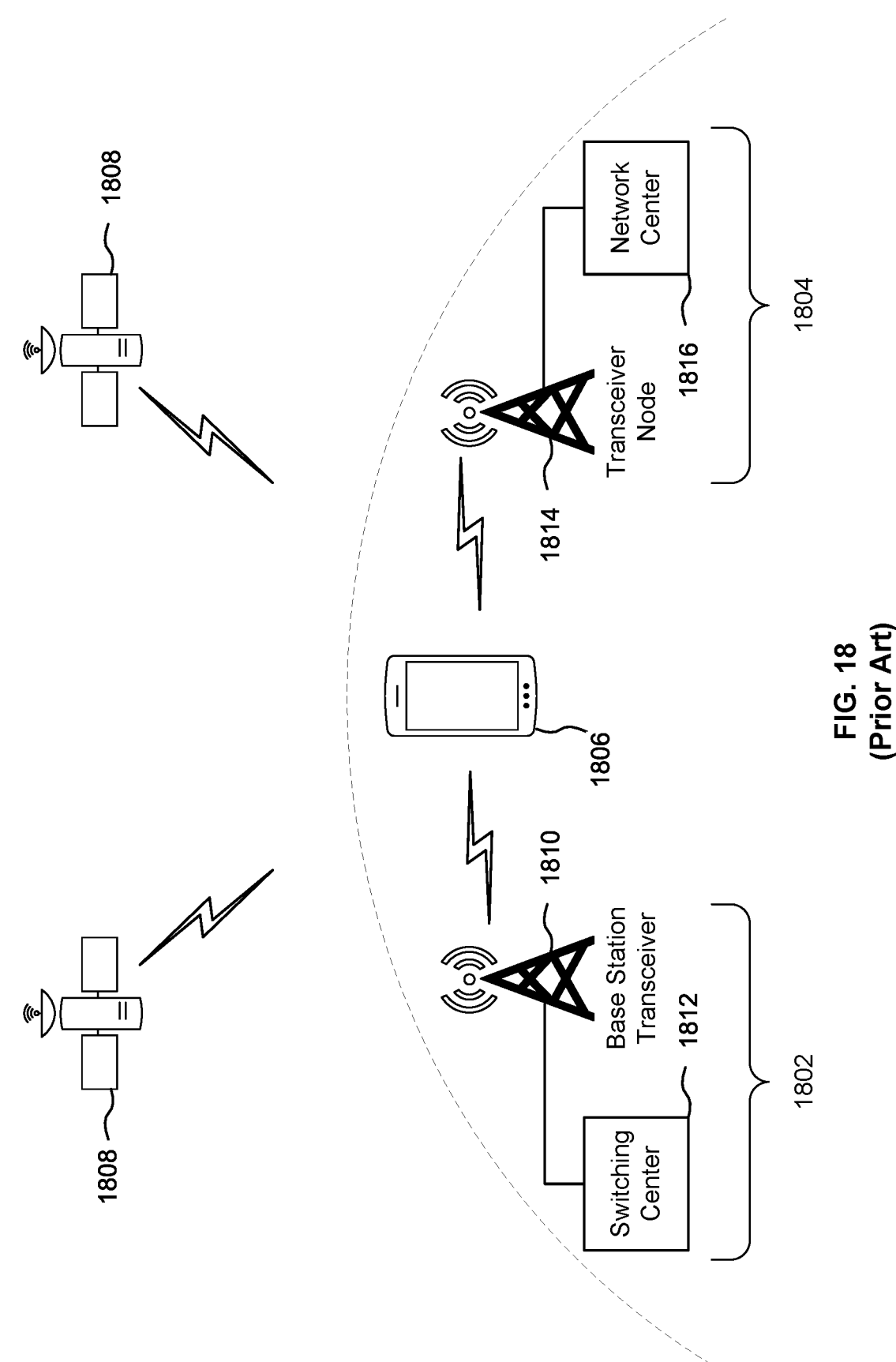
FIG. 18 illustrates a prior art wireless communication environment comprising different wireless communication systems and, and which may include one or more mobile wireless devices.

As an example of wireless RF system usage, FIG. 18 illustrates a prior art wireless communication environment 1800 comprising different wireless communication systems 1802 and 1804, and which may include one or more mobile wireless devices 1806. A wireless device 1806 may be a cellular phone, a wireless-enabled computer or tablet, or some other wireless communication unit or device. A wireless device 1806 may also be referred to as a mobile station, user equipment, an access terminal, or some other terminology known in the telecommunications industry.

A wireless device 1806 may be capable of communicating with multiple wireless communication systems 1802, 1804 using one or more of telecommunication protocols such as the protocols noted above. A wireless device 1806 also may be capable of communicating with one or more satellites 1808, such as navigation satellites (e.g., GPS) and/or telecommunication satellites. The wireless device 1806 may be equipped with multiple antennas, externally and/or internally, for operation on different frequencies and/or to provide diversity against deleterious path effects such as fading and multi-path interference.

The wireless communication system 1802 may be, for example, a CDMA-based system that includes one or more base station transceivers (BSTs) 1810 and at least one switching center (SC) 1812. Each BST 1810 provides over-the-air RF communication for wireless devices 1806 within its coverage area. The SC 1812 couples to one or more BSTs 1810 in the wireless system 1802 and provides coordination and control for those BSTs 1810.

The wireless communication system 1804 may be, for example, a TDMA-based system that includes one or more transceiver nodes 1814 and a network center (NC) 1816. Each transceiver node 1814 provides over-the-air RF communication for wireless devices 1806 within its coverage area. The NC 1816 couples to one or more transceiver nodes 1814 in the wireless system 1804 and provides coordination and control for those transceiver nodes 1814.

In general, each BST 1810 and transceiver node 1814 is a fixed station that provides communication coverage for wireless devices 1806, and may also be referred to as base stations or some other terminology known in the telecommunications industry. The SC 1812 and the NC 1816 are network entities that provide coordination and control for the base stations and may also be referred to by other terminologies known in the telecommunications industry.

Figure 19:
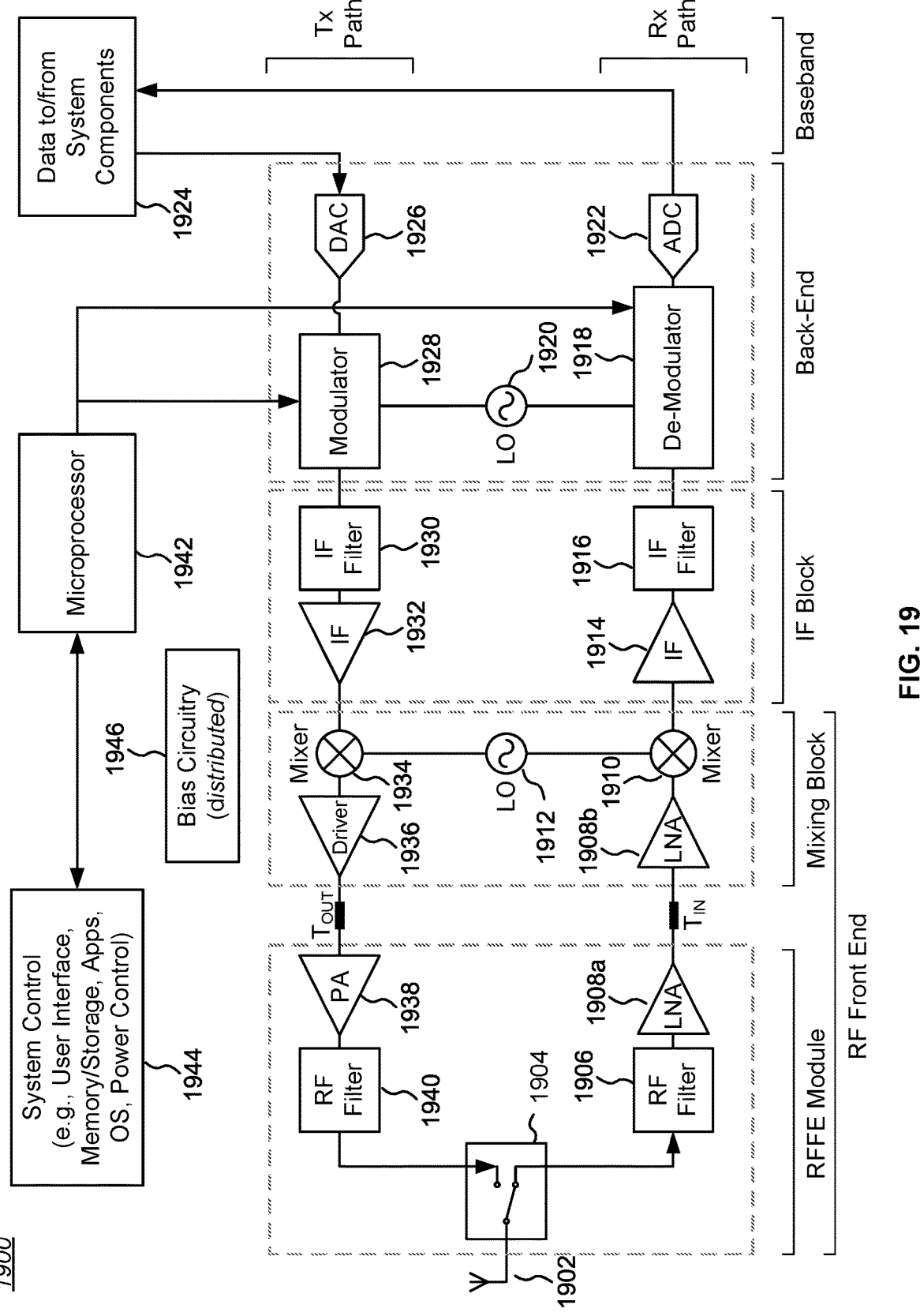
FIG. 19 is a block diagram of a transceiver that might be used in a wireless device, such as a cellular telephone, and which may beneficially incorporate an embodiment of the present invention for improved performance.

An important aspect of any wireless system, including the systems shown in FIG. 18, is in the details of how the component elements of the system perform. FIG. 19 is a block diagram of a transceiver 1900 that might be used in a wireless device, such as a cellular telephone, and which may beneficially incorporate an embodiment of the present invention for improved performance. As illustrated, the transceiver 1900 includes a mix of RF analog circuitry for directly conveying and/or transforming signals on an RF signal path, non-RF analog circuity for operational needs outside of the RF signal path (e.g., for bias voltages and switching signals), and digital circuitry for control and user interface requirements. In this example, a receiver path Rx includes RF Front End (RFFE), Intermediate Frequency (IF) Block, Back-End, and Baseband sections (noting that in some implementations, the differentiation between sections may be different). The various illustrated sections and circuit elements may be embodied in one die or multiple IC dies. For example, the RF Front End in the illustrated example may include an RFFE module and a Mixing Block, which may be embodied in (or as part of) different IC dies or modules. The different dies and/or modules may be coupled by transmission lines $T_{IN}$ and $T_{OUT}$ (e.g., microstrips, coplanar waveguides, or an equivalent structure or circuit), either or both of which may have, for example, a 50Ω impedance.

The receiver path Rx receives over-the-air RF signals through at least one antenna 1902 and a switching unit 1904, which may be implemented with active switching devices (e.g., field effect transistors or FETs) and/or with passive devices that implement frequency-domain multiplexing, such as a diplexer or duplexer. An RF filter 1906 passes desired received RF signals to at least one low noise amplifier (LNA) 1908a, the output of which is coupled from the RFFE Module to at least one LNA 1908b in the Mixing Block (through transmission line $T_{IN}$ in this example). The LNA(s) 1908b may provide buffering, input matching, and reverse isolation. In some embodiments, the LNA(s) 1908a and 1908b may be a single LNA.

The output of the LNA(s) 1908b is combined in a corresponding mixer 1910 with the output of a first local oscillator 1912 to produce an IF signal. The IF signal may be amplified by an IF amplifier 1914 and subjected to an IF filter 1916 before being applied to a demodulator 1918, which may be coupled to a second local oscillator 1920. The demodulated output of the demodulator 1918 is transformed to a digital signal by an analog-to-digital converter 1922 and provided to one or more system components 1924 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1924 is transformed to an analog signal by a digital-to-analog converter 1926, the output of which is applied to a modulator 1928, which also may be coupled to the second local oscillator 1920. The modulated output of the modulator 1928 may be subjected to an IF filter 1930 before being amplified by an IF amplifier 1932. The output of the IF amplifier 1932 is then combined in a mixer 1934 with the output of the first local oscillator 1912 to produce an RF signal. The RF signal may be amplified by a driver 1936, the output of which is coupled to a power amplifier (PA) 1938 (through transmission line $T_{OUT}$ in this example). The PA 1938 may be, for example, a power amplifier biased by a controlled source follower circuit in accordance with the present invention. The amplified RF signal may be coupled to an RF filter 1940, the output of which is coupled to at least one antenna 1902 through the switching unit 1904.

The operation of the transceiver 1900 is controlled by a microprocessor 1942 in known fashion, which interacts with system control components 1944 (e.g., user interfaces, memory/storage devices, application programs, operating system software, power control, etc.). In addition, the transceiver 1900 will generally include other circuitry, such as bias circuitry 1946 (which may be distributed throughout the transceiver 1900 in proximity to transistor devices), electrostatic discharge (ESD) protection circuits, testing circuits (not shown), factory programming interfaces (not shown), etc.

In modern transceivers, there are often more than one receiver path Rx and transmitter path Tx. for example, to accommodate multiple frequencies and/or signaling modalities. Further, as should be apparent to one of ordinary skill in the art, some components of the transceiver 1900 may be positioned in a different order (e.g., filters) or omitted. Other components can be (and often arc) added, such as (by way of example only) additional filters, impedance matching networks, variable phase shifters/attenuators, power dividers, etc.

Amplifiers in accordance with the current invention are tolerant of supply voltage variations, provide good reliability, are fast to follow $V_{CC}$ changes, and exhibit small variations in gain between high values of $V_{CC}$ and mid-to-low values of $V_{CC}$. As a person of ordinary skill in the art will understand, a system architecture is beneficially impacted by the current invention in critical ways, including better range, better reception, lower power, longer battery life, and wider bandwidth.

Methods

Figure 20:
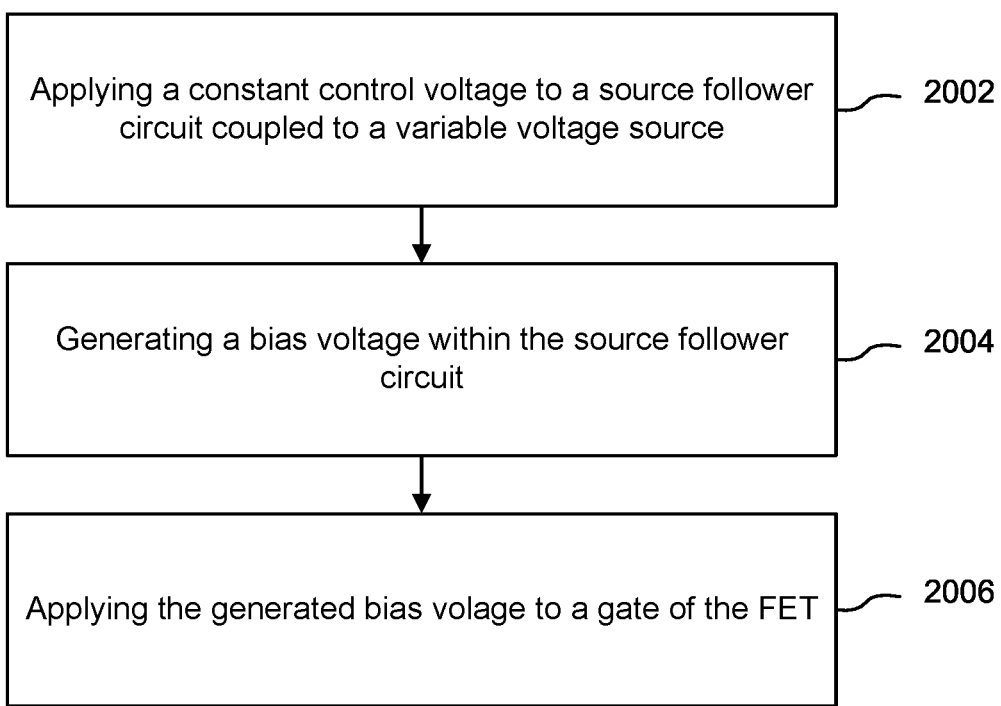
FIG. 20 is a process flow chart showing one method of biasing a FET within an amplifier stack.

Another aspect of the invention includes methods of biasing a FET within an amplifier stack. For example, FIG. 20 is a process flow chart 2000 showing one method of biasing a FET within an amplifier stack. The method includes: applying a constant control voltage to a source follower circuit coupled to a variable voltage source (Block 2002); generating a bias voltage within the source follower circuit (Block 2004); and applying the generated bias voltage to a gate of the FET (Block 2006).

Additional aspects of the above method may include one or more of the following: wherein the source follower circuit includes a transistor conduction channel coupled between the gate of the FET and the variable voltage source; wherein generating the bias voltage within the source follower circuit is a function of a constant voltage applied to the source follower circuit; wherein the source follower circuit includes a source follower transistor having a conduction channel configured to be coupled to the variable voltage source and having a gate, a first resistor coupled between the conduction channel of the source follower transistor and a reference potential, and an output between the source follower transistor and the resistor, the output configured to be coupled to the gate of the FET within the amplifier stack; wherein the constant voltage to the source follower circuit is provided by a controller that includes a transistor having a conduction channel configured to be coupled to a constant voltage source and having a gate, a second resistor coupled to the conduction channel of the transistor, a third resistor coupled between the second resistor and the reference potential, an opamp having a first input coupled to a node between the second and third resistors, a second input coupled to a reference voltage, and an output coupled to the gate of the transistor and to the gate of the source follower transistor; wherein the controller further includes a capacitor coupled to the gate of the source follower transistor; wherein the generated bias voltage is essentially constant when a voltage of the variable voltage source is above a reference voltage; wherein the generated bias voltage is proportional to a voltage of the variable voltage source when the voltage of the variable voltage source is below a reference voltage; and/or wherein the generated bias voltage is essentially constant when a voltage of the variable voltage source is above a reference voltage, and wherein the generated bias voltage is proportional to the voltage of the variable voltage source when the voltage of the variable voltage source is below the reference voltage.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHZ. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies, such as bipolar junction transistors (BJTs), BICMOS, LDMOS, BCD, GaAs HBT, GaN HEMT, GaAs pHEMT, MESFET, InP HBT, InP HEMT, FinFET, GAAFET, and SiC-based device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for case of referring to such elements, and do not in themselves indicate a particular required ordering or enumeration of elements; further, such labels may be reused in dependent claims as references to additional elements without being regarded as starting a conflicting labeling sequence).

What is claimed is:

1. A bias circuit for an amplifier stack configured to be coupled to a variable voltage source, the bias circuit including:

(a) a source follower circuit including an input terminal, an output terminal, and a control input, the source follower circuit configured to output a bias voltage on the output terminal when coupled to a gate of a transistor within the amplifier stack, and configured to have the input terminal be coupled to the variable voltage source for the amplifier stack; and (b) a controller coupled to the control input of the source follower circuit, configured to be coupled to a constant voltage source, and configured to apply a constant voltage to the control input of the source follower circuit.

2. The bias circuit of claim 1, wherein the source follower circuit includes:

(a) a source follower transistor having a conduction channel connected between the input terminal and the output terminal and configured to be coupled through the input terminal to the variable voltage source for the amplifier stack, the source follower transistor having a gate configured as the control input;

(b) a first resistor coupled between the output terminal and a reference potential; and (c) a node between the output terminal and the resistor, the node configured to be coupled to the gate of the transistor within the amplifier stack.

3. The bias circuit of claim 2, wherein the controller includes:

(a) a transistor having a conduction channel configured to be coupled to the constant voltage source and having a gate;

(b) a second resistor coupled to the conduction channel of the transistor;

(c) a third resistor coupled between the second resistor and the reference potential;

(d) an operational amplifier having a first input coupled to a node between the second and third resistors, a second input coupled to a reference voltage, and an output coupled to the gate of the transistor and to the gate of the source follower transistor.

4. The bias circuit of claim 3, further including a capacitor coupled to the gate of the source follower transistor.

5. The bias circuit of claim 2, wherein the source follower circuit outputs a constant bias voltage when a voltage of the variable voltage source is above a gate reference voltage generated within the controller.

6. The bias circuit of claim 2, wherein the source follower circuit outputs a bias voltage proportional to a voltage of the variable voltage source when the voltage of the variable voltage source is below a gate reference voltage generated within the controller.

7. The bias circuit of claim 2, wherein the source follower circuit generates a gate reference voltage and (1) outputs a constant bias voltage when a voltage of the variable voltage source is above the gate reference voltage, and (2) outputs a bias voltage proportional to the voltage of the variable voltage source when the voltage of the variable voltage source is below the gate reference voltage.

8. The bias circuit of claim 2, wherein the source follower transistor is a MOSFET.

9. A bias circuit for an amplifier stack, the bias circuit including:

(a) a source follower circuit configured to output a bias voltage when coupled to a gate of a transistor within the amplifier stack, the source follower circuit configured to be coupled to a variable voltage source for the amplifier stack, wherein the source follower circuit includes:

(1) a source follower transistor having a conduction channel configured to be coupled to the variable voltage source and having a gate;

(2) a first resistor coupled between the conduction channel of the source follower transistor and a reference potential; and (3) an output between the source follower transistor and the resistor, the output configured to be coupled to the gate of the transistor within the amplifier stack; and (b) a controller coupled to the source follower circuit, configured to be coupled to a constant voltage source, and configured to apply a constant voltage to the source follower circuit, wherein the controller includes:

(1) a transistor having a conduction channel configured to be coupled to the constant voltage source and having a gate;

(2) a second resistor coupled to the conduction channel of the transistor;

(3) a third resistor coupled between the second resistor and the reference potential;

(4) an operational amplifier having a first input coupled to a node between the second and third resistors, a second input coupled to a reference voltage, and an output coupled to the gate of the transistor and to the gate of the source follower transistor.

10. The bias circuit of claim 9, further including a capacitor coupled to the gate of the source follower transistor.

11. An amplifier, including:

(a) an amplifier stack comprising at least two series-connected FETs and configured to be coupled to a variable voltage source;

(b) a bias circuit for the amplifier stack, the bias circuit including, for at least one FET within the amplifier stack:

(1) a source follower circuit including an input terminal, an output terminal coupled to a gate of the at least one FET, and a control input, the source follower circuit configured to have the input terminal be coupled to the variable voltage source for the amplifier stack and to output a bias voltage on the output terminal to the gate of the at least one FET; and (2) a controller coupled to the control input of the source follower circuit, configured to be coupled to a constant voltage source, and configured to apply a constant voltage to the control input of the source follower circuit.

12. The amplifier of claim 11, wherein the source follower circuit includes:

(a) a source follower transistor having a conduction channel connected between the input terminal and the output terminal and configured to be coupled through the input terminal to the variable voltage source for the amplifier stack, the source follower transistor having a gate configured as the control input;

(b) a first resistor coupled between the output terminal and a reference potential; and (c) a node between the output terminal and the resistor, the node configured to be coupled to the gate of the at least one FET within the amplifier stack.

13. The amplifier of claim 12, wherein the controller includes:

(a) a transistor having a conduction channel configured to be coupled to the constant voltage source and having a gate;

(b) a second resistor coupled to the conduction channel of the transistor;

(c) a third resistor coupled between the second resistor and the reference potential;

(d) an operational amplifier having a first input coupled to a node between the second and third resistors, a second input coupled to a reference voltage, and an output coupled to the gate of the transistor and to the gate of the source follower transistor.

14. The amplifier of claim 13, further including a capacitor coupled to the gate of the source follower transistor.

15. The amplifier of claim 11, wherein the source follower circuit outputs a constant bias voltage when a voltage of the variable voltage source is above a gate reference voltage generated within the controller.

16. The amplifier of claim 11, wherein the source follower circuit outputs a bias voltage proportional to a voltage of the variable voltage source when the voltage of the variable voltage source is below a gate reference voltage generated within the controller.

17. The amplifier of claim 11, wherein the source follower circuit generates a gate reference voltage and (1) outputs a constant bias voltage when a voltage of the variable voltage source is above the gate reference voltage, and (2) outputs a bias voltage proportional to the voltage of the variable voltage source when the voltage of the variable voltage source is below the gate reference voltage.

18. The amplifier of claim 11, wherein the source follower transistor is a MOSFET.

19. The amplifier of claim 11, wherein at least one FET within the amplifier stack is coupled to and biased by a resistive ladder bias circuit.

* * * * *